(12) United States Patent
Jun et al.

(10) Patent No.: US 6,850,332 B2
(45) Date of Patent: Feb. 1, 2005

(54) METHOD FOR MEASURING STEP DIFFERENCE IN A SEMICONDUCTOR DEVICE AND APPARATUS FOR PERFORMING THE SAME

(75) Inventors: Chung-Sam Jun, Whasung-gun (KR); Kye-Weon Kim, Suwon-si (KR); Yu-Sin Yang, Yongin-si (KR); Hyo-Hoo Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/012,562

(22) Filed: Dec. 12, 2001

(65) Prior Publication Data

US 2002/0074518 A1 Jun. 20, 2002

(30) Foreign Application Priority Data

Dec. 16, 2000 (KR) ........................................ 2000-77374

(51) Int. Cl.$^7$ .............................................. G01B 11/24
(52) U.S. Cl. .................. 356/609; 356/237.4; 356/237.5
(58) Field of Search ........................... 356/237.4, 237.5, 356/601, 609, 2, 3, 237.1, 237.2

(56) References Cited

U.S. PATENT DOCUMENTS

| | | | |
|---|---|---|---|
| 4,689,491 A | * | 8/1987 | Lindow et al. ........ 250/559.07 |
| 4,931,630 A | | 6/1990 | Cohen et al. |
| 5,557,113 A | * | 9/1996 | Moorhouse et al. ........ 356/609 |
| 6,005,669 A | | 12/1999 | Pahk et al. |
| 6,346,986 B1 | * | 2/2002 | Nguyen ........................ 356/601 |
| 6,590,670 B1 | * | 7/2003 | Kato et al. ................... 356/609 |

FOREIGN PATENT DOCUMENTS

| JP | 10-26515 | 1/1998 |
|---|---|---|
| KR | 10-0233621 | 9/1999 |

* cited by examiner

*Primary Examiner*—Richard A. Rosenberger
*Assistant Examiner*—Vincent P. Barth
(74) *Attorney, Agent, or Firm*—Volentine Francos & Whitt, PLLC

(57) ABSTRACT

A method and an apparatus for measuring a step difference in a semiconductor device without making contact with the semiconductor device. A first beam is radiated onto a wafer so as to form a first focus on a first portion of the wafer, and a second beam is radiated onto the wafer so as to form a second focus on a second portion of the wafer. The step difference between the first portion and the second portion of the wafer is measured by calculating a vertical displacement distance of the wafer and a beam focusing device used to attain the first focus and the second focus.

12 Claims, 9 Drawing Sheets

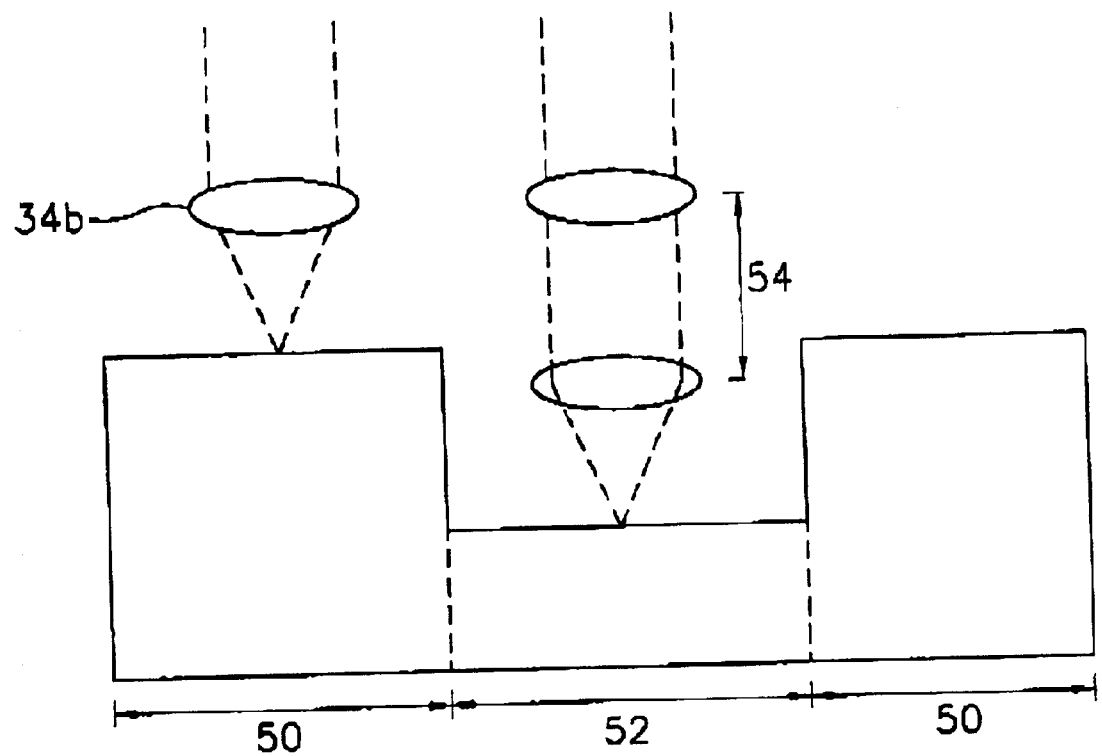

METHOD FOR MEASURING STEP DIFFERENCE IN A SEMICONDUCTOR DEVICE AND APPARATUS FOR PERFORMING THE SAME

BACKGROUND OF THE INVENTION

1. Field of the Invention

The present invention relates to a method for measuring a step difference in a semiconductor device and an apparatus for performing the same. More particularly, the invention relates to a method for measuring a step difference in a semiconductor device without making contact with the semiconductor device.

2. Description of the Related Arts

Generally, a semiconductor chip is fabricated by treating a silicon wafer through various stages of a semiconductor manufacturing process, including lithography, exposure, ion implantation, chemical and mechanical polishing, chemical or physical deposition and plasma etching. While performing the above processes, a step difference is generated in a wafer between a lower structure and an upper structure formed on the wafer. If the step difference exceeds a predetermined value, the quality of the wafer may be deteriorated.

Since present semiconductor devices have a high degree of integration, various structures or layers are continually formed on the wafer, so the step difference problem occurs frequently in conventional semiconductor manufacturing processes. Accordingly, it is essential to optimize process conditions by precisely measuring the step difference between different step areas of the wafer.

Conventionally, the step difference is measured using a sensing needle which makes contact with the stepped area of the wafer. A significant drawback to this method is that the sensing needle may cause damage to the surface of the wafer. In addition, since the sensing needle may wear out over time, the step value as measured by the sensing needle will vary, depending on the condition of the needle, Accordingly, the sensing needle must be changed periodically, which increases the cost of manufacturing the semiconductor device.

In order to solve the above problem, methods and apparatus have been proposed which purport to measure the step difference between step areas of the wafer without making contact with the wafer. One example of a non-contact measuring method is disclosed in Japanese Patent Laid-Open Publication No. 10-26515. In which a beam is radiated onto the surface of the wafer and a focusing position is detected by measuring the strength of a reflection beam so as to determine the step difference. However, since the above method detects the focusing position by differentiating a signal beam strength, it is difficult to precisely detect the focusing position, so the ability to rely on the measured value is lowered.

An example of a non-contact measuring apparatus is disclosed in U.S. Pat. No. 4,931,630, in which a focusing point is detected by sensing the strength of the interference pattern generated when a beam is radiated onto a predetermined surface of the wafer. Further, an apparatus for inspecting the pattern using scattered light is disclosed in Korea Patent Publication No. 10-0233621. While this apparatus can detect and inspect the pattern, it can not measure the step difference.

SUMMARY OF THE INVENTION

In view of the foregoing problems and drawbacks of the related art, a first object of the present invention is to provide a method for measuring a step difference in a semiconductor device in a non-contact and accurate manner.

A second object of the present invention is to provide an apparatus for measuring the step difference in the semiconductor device in a non-contact and accurate manner.

To accomplish the first object, the present invention provides a method in which a first beam is focused onto a wafer at a first focus point that is located at a first portion of a surface of the wafer. A second beam is focused onto the wafer at a second focus point that is located at a second portion of the surface of the wafer. Then, the step difference between the first portion and the second portion of the wafer is measured by calculating a distance the wafer and/or a focusing lens move in the vertical direction to achieve the respective focus points.

To accomplish the second object, the present invention provides an apparatus having a wafer chuck on which a wafer is placed, and a beam source for radiating a beam toward the wafer. A beam focusing part focuses the beam on a portion of the surface of the wafer, while a focus checking part checks whether or not the beam is correctly focused on the wafer surface portion. A focus adjusting part adjusts the focus position in response to a signal received from the focus checking portion. A data output part outputs the vertical distance the wafer and the beam focusing part move in order to achieve the desired focus position.

Accordingly, the method and apparatus of the present invention can precisely measure the step difference of the semiconductor device, without making contact with the semiconductor device, thereby preventing damage to the semiconductor device. In addition, the time for measuring the step difference is reduced, so the productivity and throughput of the semiconductor device manufacturing process is improved.

BRIEF DESCRIPTION OF THE DRAWINGS

The above objects and other advantages of the present invention will become more apparent by describing in detail a preferred embodiment thereof with reference to the attached drawings, in which:

FIG. 5 Is a schematic view showing the method for measuring the step difference at a trench device isolating area and an active area using the method as shown in FIGS. 4A to 4C.

DESCRIPTION OF THE PREFERRED EMBODIMENT

The present invention will now be described more fully with reference to the accompanying drawings, in which a preferred embodiment of the invention is shown. This invention may, however, be embodied in many different forms and should not be construed as being limited to the embodiments set forth herein. Rather, the embodiments are provided so that this disclosure will be thorough and complete, and will fully convey the concept of the invention to those skilled in the art.

Figure 1:
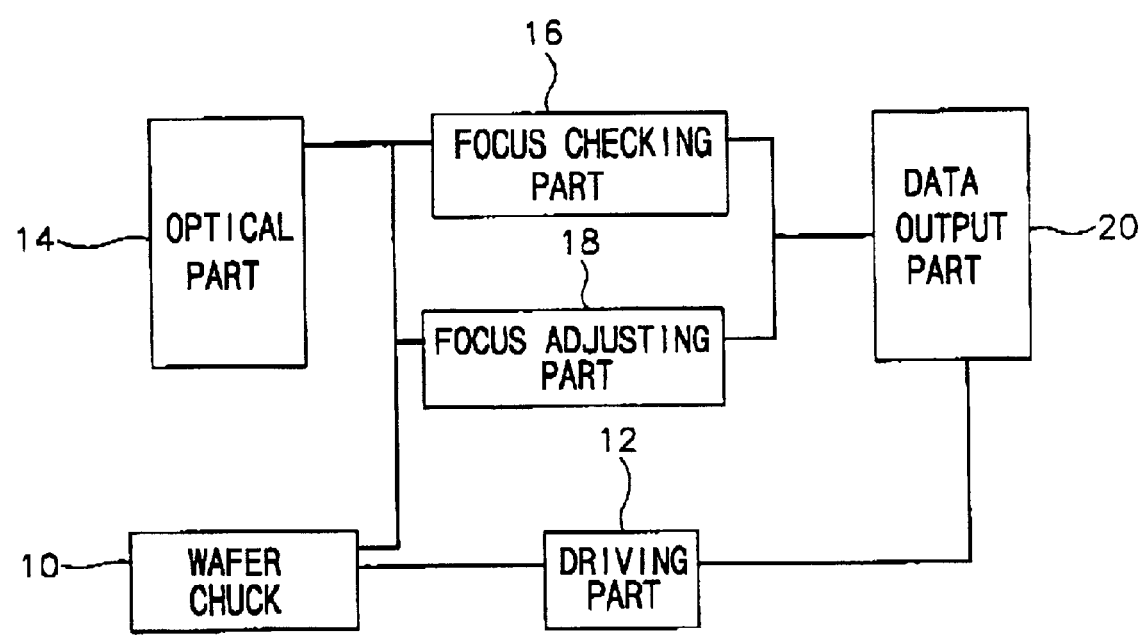
FIG. 1 is a block diagram showing an apparatus for measuring a step difference according to an embodiment of the present invention.

FIG. 1 provides a block diagram of an apparatus for measuring a step difference of a semiconductor device according to an embodiment of the present invention. In FIG. 1 a wafer chuck 10, on which a wafer to be measured is placed, is connected to a driving part 12. The driving part 12 rotates the wafer chuck 10, as well as laterally moves the wafer chuck 12 in a horizontal plane in forward, backward, left and right directions as viewed by an operator. Accordingly, the position of the wafer chuck 10, and thus the wafer positioned thereon, can be varied so that the step difference of various portions of the wafer can be measured. An optical part 14 radiates a beam towards the wafer in such a manner that the beam is focused on a predetermined portion of the surface of the wafer.

A focus checking part 16 is connected to the optical part 14. The focus checking part 16 determines whether or not the focus is correctly positioned on the predetermined portion of the surface of the wafer. A focus adjusting part 18 is connected to the focus checking part 16, and adjusts the position of the focus based on a signal received from the focus checking part 16. The focus adjusting part 18 moves the optical portion 14 or the wafer chuck 10 in a vertical direction (either upward or downward) as viewed by an operator, to thereby adjust the position of the focus on the predetermined portion of the surface of the wafer. Accordingly, the position of the focus is varied by the focus adjusting part 18 until the focus is correctly positioned on the predetermined portion of the surface of the wafer.

In addition, a data output part 20 is connected to the focus checking part 16, the focus adjusting part 18 and the driving part 12. The data output part 20 outputs the vertical distance the focus moved, as well as the movement of the wafer chuck so as to measure the step difference at various portions of the wafer.

Figure 2:
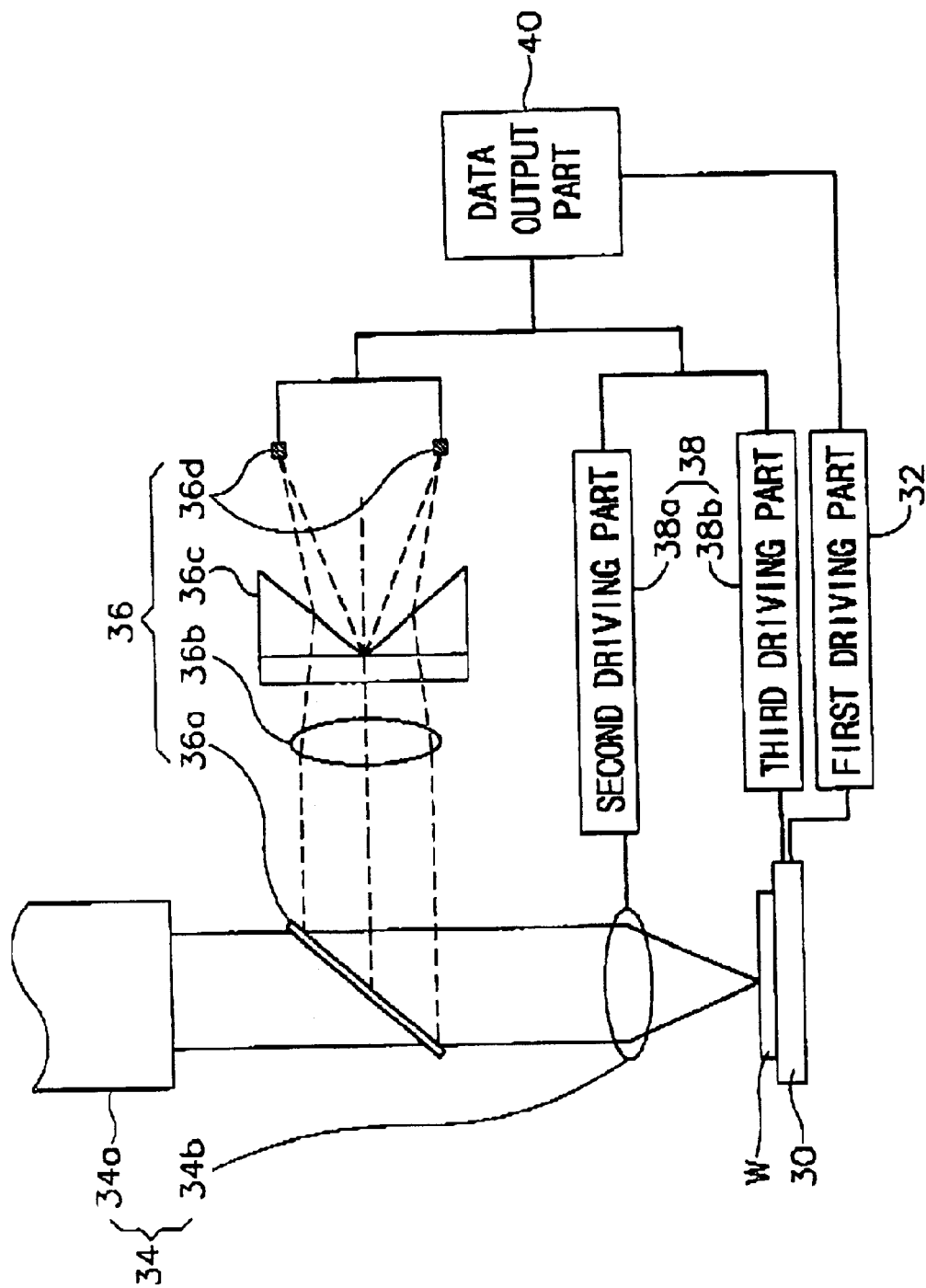
FIG. 2 is a schematic view showing the structure of the apparatus for measuring the step difference according to an embodiment of the present invention.

FIG. 2 is a schematic diagram of an apparatus for measuring the step difference of the semiconductor device according to an embodiment of the present invention. In FIG. 2, a wafer chuck 30 Is provided, on which a wafer W to be measured is placed. A first driving part 32 is connected to the wafer chuck 30 so as to rotate and move the wafer chuck 30 laterally (or horizontally) in forward, backward, left and right directions (as viewed by the operator) in such a manner that the step difference may be measured with respect to a plurality portions on the wafer W. The first driving part 32 includes a motor to effect the lateral movement and rotation of the wafer chuck 30.

An optical part 34 is located above the wafer chuck 30. The optical part 34 includes a beam source 34a for radiating the beam towards the wafer W, and a first lens 34b for focusing the beam on the surface of the wafer W. Preferably, the beam source 34a radiates a monochromatic beam which has only one wave length. This prevents distortion of the beam caused by the variation of the wave length when the beam is focused on the wafer W. A laser beam, for example, can be used as the monochromatic beam. The beam radiated from the beam source 34a is focused on the wafer W placed on the wafer chuck 30 by means of the first lens 34b.

A focus checking part 36 interacts with the optical part 34, to determine whether or not the focus is correctly positioned on a predetermined portion of the surface of the wafer W. The focus checking part 36 includes a beam splitter 36a installed in the beam path between the beam source 34a and the first lens 34b, with the beam splitter 36a having an upper surface and a lower surface. The incident beam radiates from the beam source 34a towards and through the upper surface of the beam splitter 36a. The beam reflected from the surface or the wafer W is directed towards the lower surface of the beam splitter 36a, and then is redirected at a certain angle depending on the orientation angle of the beam splitter 36a. The beam reflected from the lower surface of the beam splitter 36a is focused by a second lens 36b positioned in the path of the reflected beam, and then refracted by a third lens 36c positioned downstream of the second lens 36b. A beam detecting part 36d is capable of detecting the beam passing through the third lens 36c when the beam is correctly focused. In other words, the beam detecting part 36d detects the beam when the focus of the beam is correctly positioned on the predetermined portion of the wafer W, otherwise it will not detect the beam.

More specifically, when the beam is correctly focused on the predetermined portion of the wafer W, the incident route of the beam is identical to the reflection route of the beam. Note that the second and third lenses 36b and 36c cooperate to focus the reflection beam on the beam detecting part 36d. Since the reflection beam reflected from the wafer W can be focused on several different portions of the wafer, a plurality of beam detecting parts 36d may be positioned to respectively correspond to the several different portions of the wafer. Accordingly, only when the beam is correctly focused on the predetermined portion of the wafer W, will the beam detecting part 36d be able to detect the reflection beam.

A focus adjusting part 38 is connected to the focus checking part 36. The focus adjusting part 38 adjusts the position of the focus based on a signal received from the focus checking part 36. The focus adjusting part 38 includes a second driving part 38a and a third driving part 38b which are capable of varying the distance between the first lens 34b and the wafer W so as to adjust the position of the focus. The second driving part 38a includes a motor and is connected to the first lens 34b of the optical part 34 so as to move the first lens 34b up and down (i.e., vertical as viewed by an operator). The third driving part 38b is connected to the wafer chuck 30 so as to move the wafer chuck 30 up and down vertically as viewed by an operator. The third driving part 38b includes a motor or a piezo-electric device to effect the movement. Accordingly, the focus of the beam can be positioned at the predetermined portion of the wafer W by varying the vertical distance between the first lens 34b and the wafer W using the second and third driving parts 38a and 38b.

A data output part 40 is connected to the focus checking part 36, the focus adjusting part 38 and the first driving part 32. The data output part 40 outputs the vertical displacement distance the focus moved (described further below), as well as the lateral movement of the wafer chuck 30, so as to determine the step difference at various portions of the surface of the wafer.

Figure 3A:
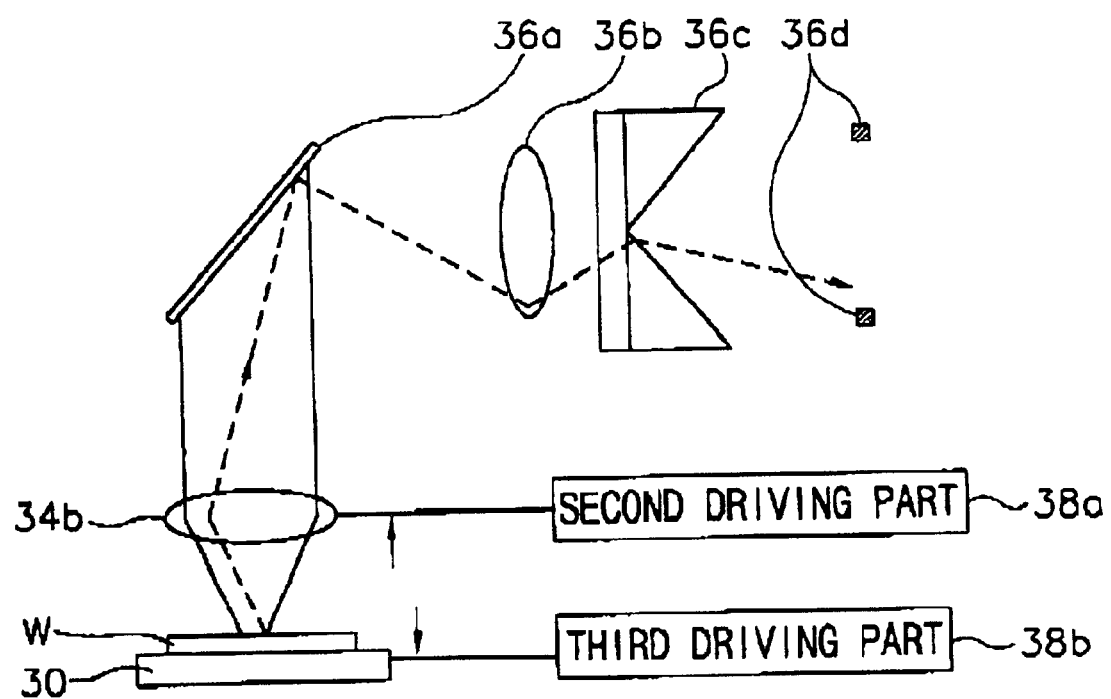
FIGS. 3A and 3B are schematic views for explaining a state of the apparatus shown in FIG. 2 in which the beam is erroneously focused on a wafer.
Figure 3B:
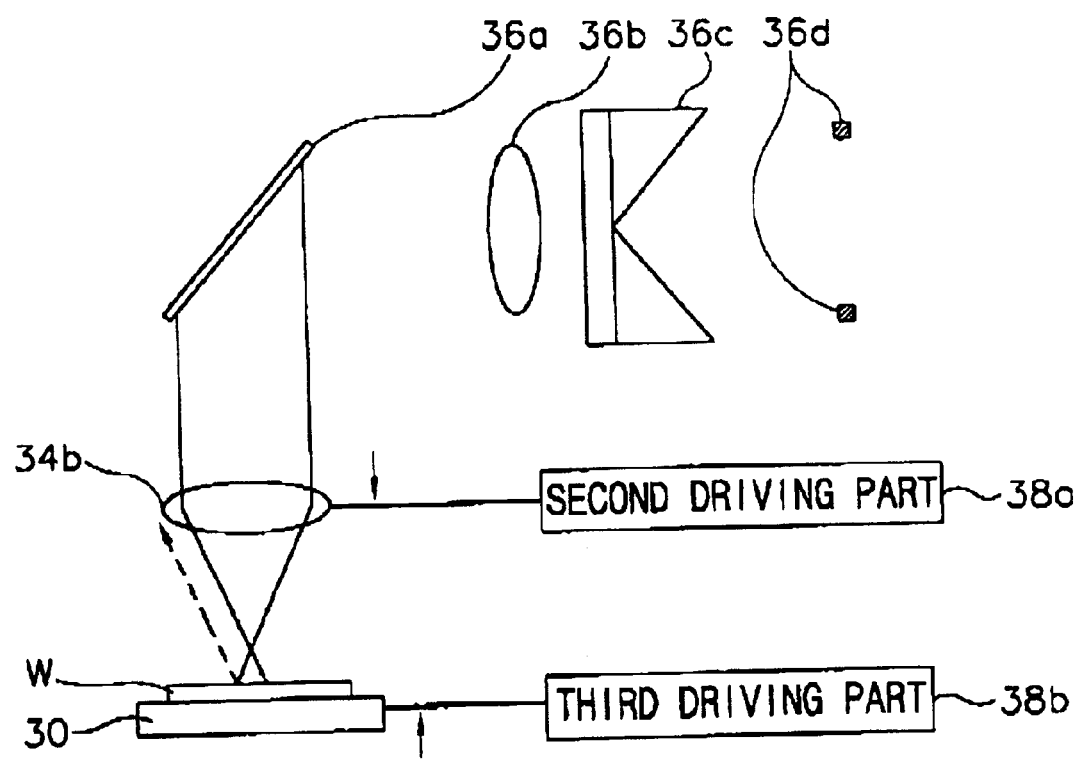

FIGS. 3A and 3B are schematic views for explaining a situation where the beam is erroneously focused on the wafer W. FIG. 3A shows a state in which the distance between the first lens 34b and the wafer W is too close.

As shown in FIG. 3A, the beam radiated from the beam source is focused on the surface of the wafer W by means of the first lens 34b. However, the focused beam is not correctly positioned on the predetermined portion of the wafer W, since the distance between the first lens 34b and the wafer W is closer than it should be. Therefore, the reflection beam reflected from the surface of the wafer W cannot be incident onto the beam detecting part 36d. Accordingly, the beam detecting part 36d determines that the focus of the beam is not positioned on the predetermined portion of the wafer W.

Until the reflection beam is indeed detected by the beam detecting part 36d, the focus adjusting part 38 adjusts the position of the focus by driving the second driving part 38a or the third driving part 38b, to vary the vertical distance between the first lens 34b and the wafer W, More specifically, as shown by the arrows in FIG. 3A, the second driving part 38a would move the first lens 34b upward, or the third driving part 38b would move the wafer chuck 30 on which the wafer W is placed downward. Alternatively, rather than just move one or the other, some simultaneous combination of movement between of the first lens 34b and wafer chuck 30 may be employed. In either case, the distance between the wafer W and the first lens 34b is varied until the focus of the beam is correctly positioned on the predetermined portion of the wafer W, as determined by the beam detecting part 36d.

FIG. 3B illustrates a state in which the focus is not positioned on the predetermined portion of the wafer W because the distance between the first lens 34b and the wafer W is too far. As a result, the reflection beam reflected from the surface of the wafer W cannot be incident onto the beam detecting part 36d.

As in the prior case, until the reflection beam is detected by the beam detecting part 36d, the focus adjusting part 38 adjusts the position of the focus by driving the second driving part 38a and the third driving part 38b. More specifically, as shown by the arrows in FIG. 3B, the second driving part 38a would move the first lens 34b downward, or the third driving part 38b would move the wafer chuck 30 on which the wafer W is placed upward. Alternatively, rather than just move one or the other, some simultaneous combination of movement between of the first lens 34b and wafer chuck 30 may be employed. In either case, the distance between the wafer W and the first lens 34b is varied until the focus of the beam is correctly positioned on the predetermined portion of the wafer W, as determined by the beam detector part 36d.

Figure 4A:
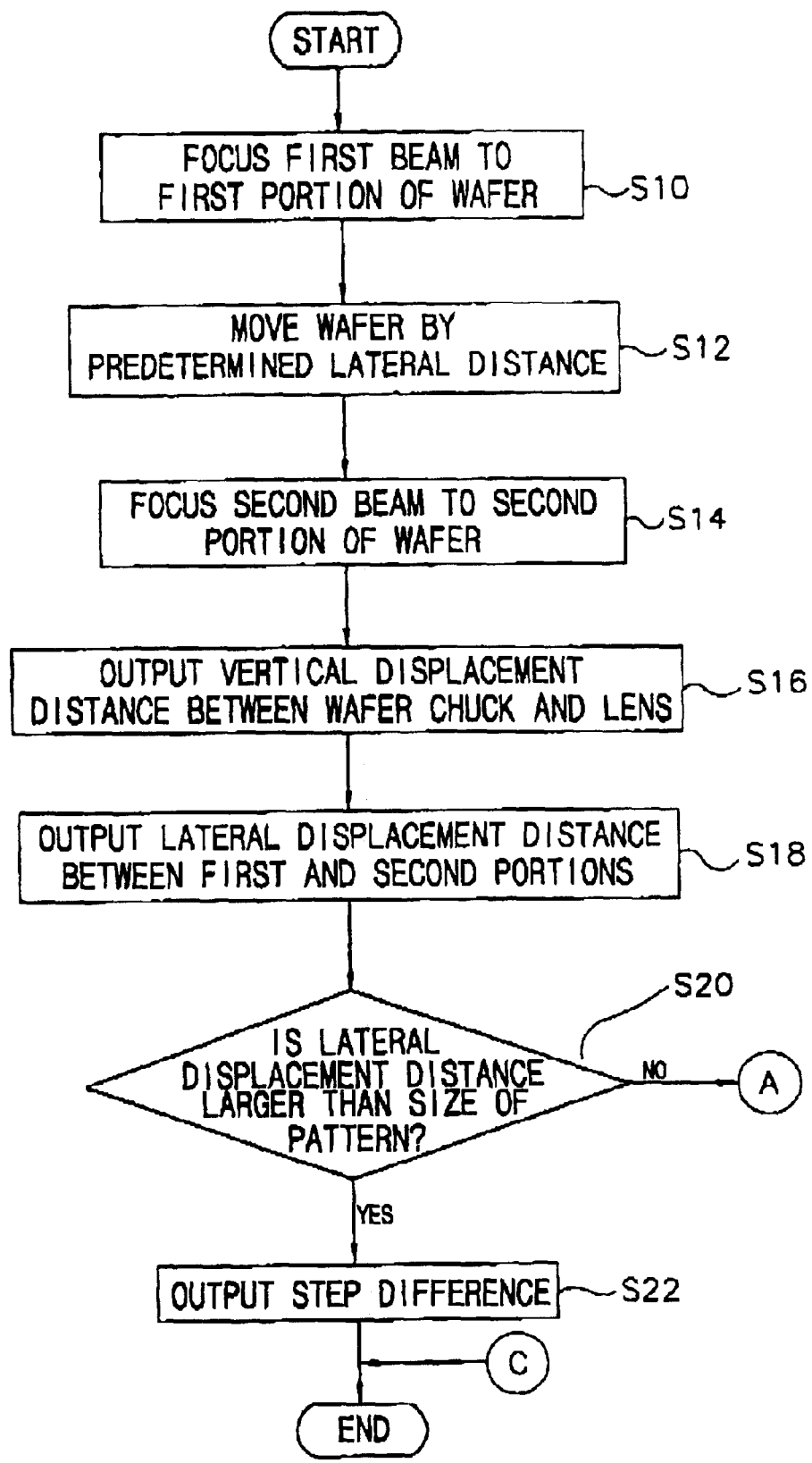
FIGS. 4A to 4C are flow charts illustrating a method for measuring the step difference according to an embodiment of the present invention.
Figure 4B:
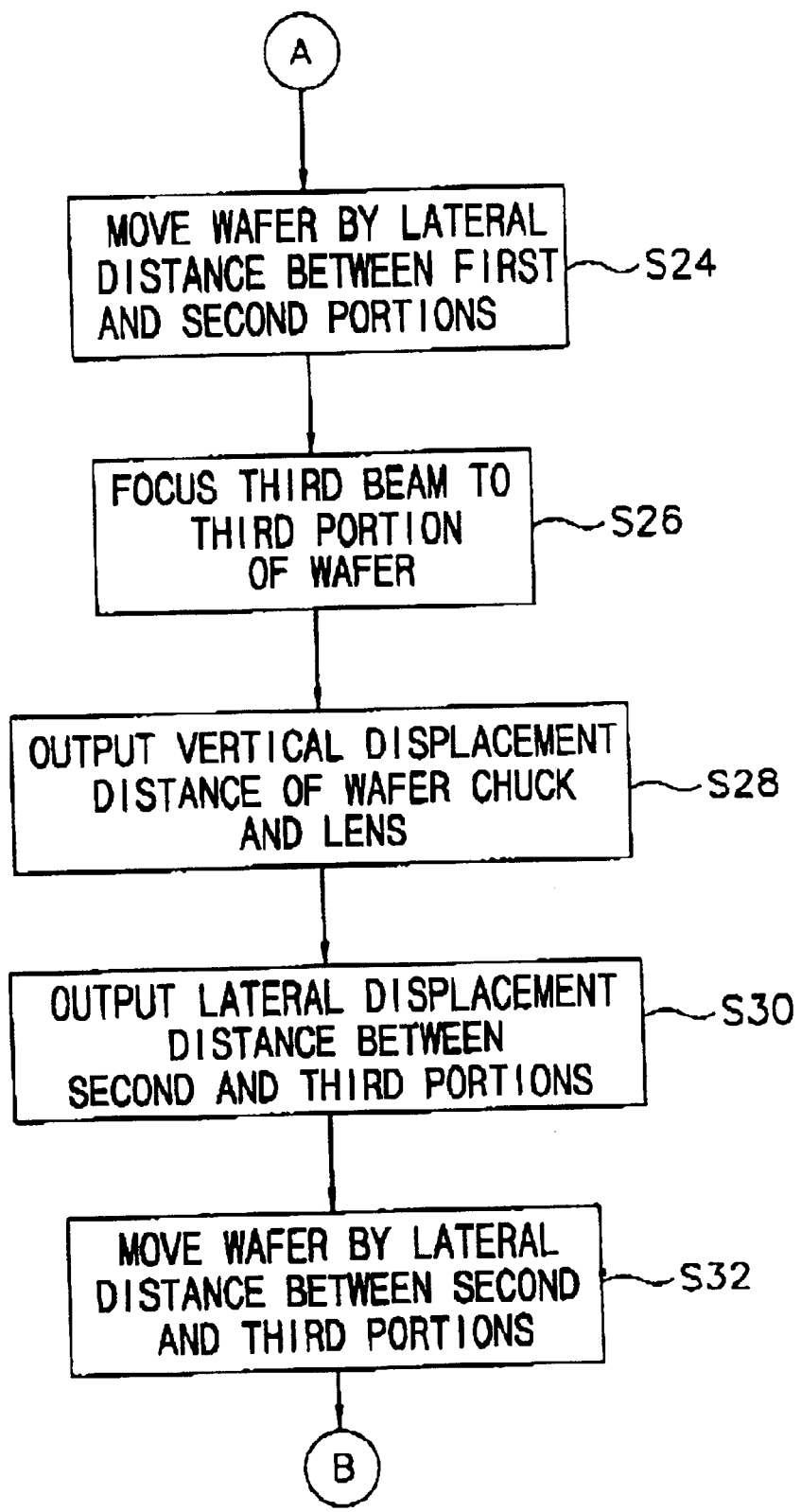
Figure 4C:
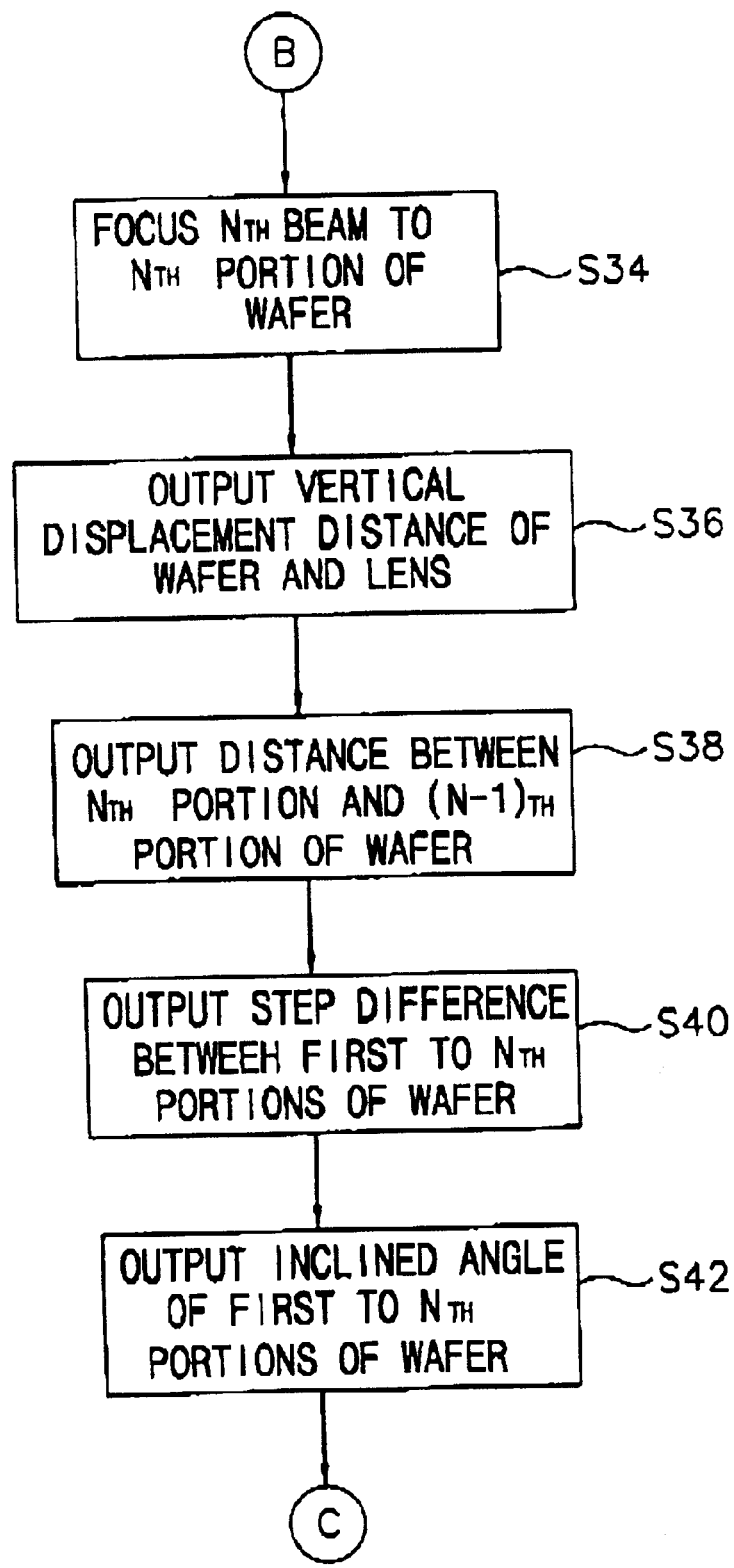

FIGS. 4A to 4C are flow charts illustrating a method for measuring the step difference according to an embodiment of the present invention.

Referring to FIGS. 4A to 4C, the first beam radiated from the beam source 34a is focused on the surface of the wafer W by means of the first lens 34b. The first beam passes through the first lens 34b so as to be focused on the surface of the wafer W. In addition, the first beam focused on the surface of the wafer W is checked and adjusted by the focus checking part 36 and the focus adjusting part 38, respectively, such that the first beam is focused on a first portion of the surface of the wafer W (step S10). At this time, the first lens 34b and/or the wafer chuck 30 is moved up or down vertically by the second driving part 38a or the third driving part 38b, while the focus checking part 36 checks whether or not the focus is correctly positioned on the first portion of the wafer W.

Then, the first driving part 32 connected to the wafer chuck 30 laterally moves the wafer chuck 30 a predetermined distance to a second portion of the wafer W so as to compare the step difference between the first portion and the second portion of the wafer W (step S12).

Thereafter, a second beam is focused on the surface of the wafer W after passing through the first lens 34b. The second beam is checked and adjusted by the focus checking part 36 and the focus adjusting part 38, respectively, such that the focus of the second beam is positioned on the second portion of the wafer W (step S14). At this time, the first lens 34b and/or the wafer chuck 30 is moved up or down by the second driving part 38a or the third driving part 38b, while the focus checking part 36 checks whether or not the focus of the second beam is correctly positioned on the second portion of the wafer W.

When the focus of the first beam is positioned on the first portion of the wafer W, the positions of the first lens 34b and the wafer chuck 30 become the so-called reference position, When the first lens 34b and the wafer chuck 30 move up or down vertically so as to enable the beam to be correctly focused on the second portion of the wafer W, the data output part 40 outputs the data representing the positive or negative displacement distance of the first lens 34a and the wafer chuck 30 in the vertical direction based on the reference position of the first lens 34b and the wafer chuck 30 (step S16). The vertical displacement distance represents the difference between this so-called measured position of the first lens 34b and the wafer chuck 30 at the second portion, and the reference position a the first portion.

In addition, the data output part 40 outputs the data representing the lateral displacement distance of the wafer chuck 30 when the wafer chuck 30 is laterally moved to the second portion of the wafer W from the first portion of the wafer W (step S18).

Note that the distance between the first lens 34b and the first portion of the wafer W when the focus is correctly positioned at the first portion of the wafer W is identical to the distance between the first lens 34b and the second portion of the wafer W when the focus is correctly positioned at the second portion of the wafer. Therefore, the vertical displacement distance of the wafer chuck 30 and the first lens 34b required to correctly position the focus at the second portion of the wafer W corresponds to the step difference between the first portion and the second portion of the wafer W. As described above, the positions of the first lens 34b and the wafer chuck 30 when the focus is positioned at the first portion of the wafer W become the reference position.

Then, the lateral displacement distance between the first portion and the second portion of the wafer W is measured so as to check whether or not the distance is larger than a pattern of a structure included within the first portion (step S20). If the lateral displacement distance is larger than the pattern of the structure, it confirms that the second portion on which the focus has been positioned has indeed detected structure which is different from the first portion.

Based on the reference position, the vertical displacement distance of the first lens 34b or the wafer chuck 30 and the lateral displacement distance between the first portion and the second portion of the wafer W are calculated, thereby outputting the step difference between the first portion and the second portion of the wafer W (step S22). In this case, step portions in the structure have a horizontal profile and a vertical profile.

If the distance between the first portion and the second portion of the wafer W is less than the pattern size of the structure included within the first portion (step S20), it confirms that the first portion and the second portion are detected within the same pattern structure on the wafer.

In either case, the wafer chuck 30 is moved to a third position by the first driving part 32 at the same lateral distance interval between the first portion and the second portion (step S24). Then, a third beam is focused at a third portion of the wafer W (step S26). The vertical displacement distance of the wafer chuck 30 or the lens 34b to correctly place the focus at the third portion is determined and outputted (step S28), In the same manner as steps S14 and S16. In addition, the lateral displacement distance between the second portion and the third portion of the wafer W is outputted (step S30).

Then, the wafer chuck 30 is sequentially moved laterally, using the same lateral distance interval as that between the first portion and second portion, so as to focus the beam at a fourth portion to Nth portion (steps S32 and S34) of the surface of the wafer. During each of these fourth through Nth focusing sequences, the vertical displacement of the wafer chuck 30 or the lens 34b in up and down directions is respectively outputted (step S36), and the lateral displacement distance between the portions of the wafer W is also respectively outputted (step S38).

By respectively outputting the vertical displacement distance of the wafer chuck 30 or the lens 34b at each portion of the wafer W, and the lateral displacement distance between the portions of the wafer W, the step differences from the first portion to the Nth portion of the wafer W can be obtained (step S40). By using the outputted data, the profiles of the structures included within the first portion to Nth portion can be schematically detected. The above method can detect discrete step differences between wafer portions, that is, structure heights defining different horizontal planes. In addition, the above method can detect step differences within wafer portions that do not have discrete horizontal and vertical profiles, but rather have an inclined angled profile or the like (step S42).

FIG. 5 is a schematic view showing the method for measuring the step difference at each of a trench device isolating area and an active area using the step difference measuring method shown in FIGS. 4A to 4C.

The trench device isolating region 52 and the active regions 50 have stepped portions having horizontal and vertical profiles, and have discrete structure heights defining different horizontal planes. As shown in FIG. 5, the beam is first radiated to the active region 50 such that the focus is correctly positioned at a first portion of the active region 50. Then, the wafer chuck 30 moves laterally by a predetermined distance, which in this embodiment is larger than a size of the pattern of the active region 50, such that the focus can be detected from a second portion of the trench device isolating region 52 in the wafer W.

The positions of the first lens 34b and the wafer chuck 30 when the beam is focused at the first portion of the active region 50 become the reference position. Based on the reference position, a vertical displacement distance 54 of the first lens 34b, which is moved downwardly so as to allow the focus to be positioned at the second portion of the trench device isolating region 52 (i.e., the measured position), is outputted thereby accurately determining the step difference. Alternatively, the step difference can be measured by moving just the wafer chuck 30 upwardly, or some combination of the movement of the first lens 34b and the wafer chuck 30.

Figure 6:
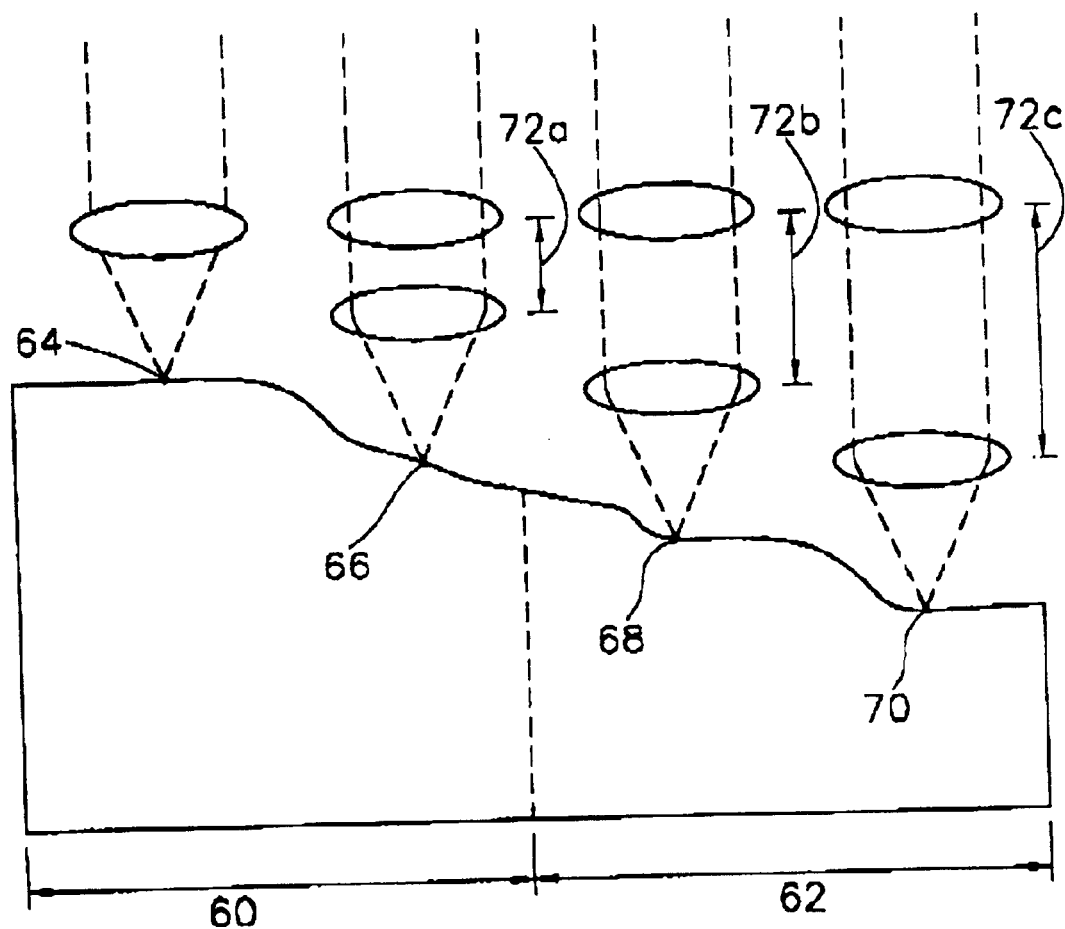
FIG. 6 Is a schematic view showing the method for measuring the step difference between a cell region and a peripheral area.

FIG. 6 is a schematic view showing the method for measuring the step difference at a cell region 60 and a peripheral region 62 of the semiconductor device by using the step difference measuring method shown in FIGS. 4A to 4C.

In the semiconductor device, a plurality of structures are stacked on the cell region 60 comprising numerous device units, thereby forming relatively complex and tall patterns in the cell region 60. By contrast, the patterns within the peripheral region 62, in which peripheral circuits are arranged for driving the device units of the cell region 60, have relatively simple shapes and low pattern structures. Accordingly, a step difference is formed between the cell region 60 and the peripheral region 62.

However, since the step portions in the cell and peripheral regions 60 and 62 have curved shapes, rather than precise horizontal and vertical shapes as in FIG. 5, the step difference cannot be precisely measured by comparing just two adjacent portions of the cell and peripheral regions 60 and 62. Accordingly, the beam is sequentially focused on a plurality of portions included in the cell and peripheral regions 60 and 62. Then, the step difference is sequentially measured at the plurality of portions.

More specifically, the beam is focused on a first portion 64 of the cell region 60. Then, the wafer chuck 30 moves laterally by a predetermined distance which is less than the size of the pattern of the cell region 60, thereby allowing the beam to be focused at a second portion 66 of the cell region 60.

By continuously moving the wafer chuck 30 laterally by the predetermined distance, the beam is focused at a third portion 68 and a fourth portion 70 of the cell region 60.

The respective vertical displacement distances 72a, 72b and 72c of the first lens 34b or the wafer chuck 30 are calculated, in which the first lens 34b and/or the wafer chuck 30 are moved by the second and third driving part in order to allow the beam to be focused at the first to fourth portions 64, 66, 68 and 70 of the cell region 60. Then, the vertical displacement distances between the first to fourth portions 64, 66, 68 and 70 of the cell region 60 are outputted.

By using the vertical displacement distances 72a, 72b and 72c of the first lens 34b or the wafer chuck 30, the step difference in the cell region 60 and the peripheral region 62 are measured.

When the step differences at the first to fourth portions 64, 66, 68 and 70 of the cell region 60 and peripheral region 62 are measured, a schematic profile from the cell region 60 to the peripheral region 62 can be obtained. The inclined angles of the cell region 60 and the peripheral region 62 can be measured by using the profile. Accordingly, the step difference in the cell region 60 and the peripheral regions 62 can be precisely measured. It is also possible to more finely divide the portions of cell region 60 so as to measure the step difference within the cell region 60.

According to the present invention, the step difference between predetermined portions of the wafer can be measured without making contact with the semiconductor device. As a result, damage to the semiconductor device is prevented and the step difference is precisely measured. In addition, the time for measuring the step difference can be reduced so that the productivity of the semiconductor device manufacturing process can be improved.

Although the present invention was described with regard to the preferred embodiment disclosed above, it will be understood by those skilled in the art that the present invention should not be limited to the described preferred embodiment, but various changes and modifications can be made within the spirit and scope of the invention as defined by the appended claims.

What is claimed is:

1. A method for measuring a step difference in a semiconductor device, the method comprising:
   i) vertically moving a focusing lens relative to a horizontal surface of a wafer to focus a first beam onto the wafer such that a first focus point of the first beam is positioned at a first portion of a surface of the wafer;

ii) vertically moving the focusing lens relative to the horizontal surface of the wafer to focus a second beam onto the wafer such that a second focus point of the second beam is positioned at a second portion of the surface of the wafer which is horizontally displaced from the first portion of the surface of the wafer; and iii) measuring the step difference between the first portion and the second portion of the wafer by (a) determining a reference position of the wafer relative to the focusing lens when the first focus point is positioned at the first portion of the surface of the wafer, (b) determining a measured position of the wafer relative to the focusing lens when the second focus point is positioned at the second portion of the surface of the wafer, and (c) determining a vertical displacement distance between the reference position and the measured position, wherein the vertical displacement distance is indicative of the step difference between the first portion and the second portion of the wafer;

wherein a distance between the first portion and the second portion of the wafer is greater than a size of a pattern of a structure within the first portion.

2. A method for measuring a step difference in a semiconductor device, the method comprising:

i) vertically moving a focusing lens relative to a horizontal surface of a wafer to focus a first beam onto the wafer such that a first focus point of the first beam is positioned at a first portion of a surface of the wafer;

ii) vertically moving the focusing lens relative to the horizontal surface of the wafer to focus a second beam onto the wafer such that a second focus point of the second beam is positioned at a second portion of the surface of the wafer which is horizontally displaced from the first portion of the surface of the wafer; and iii) measuring the step difference between the first portion and the second portion of the wafer by (a) determining a reference position of the wafer relative to the focusing lens when the first focus point is positioned at the first portion of the surface of the wafer, (b) determining a measured position of the wafer relative to the focusing lens when the second focus point is positioned at the second portion of the surface of the wafer, and (c) determining a vertical displacement distance between the reference position and the measured position, wherein the vertical displacement distance is indicative of the step difference between the first portion and the second portion of the wafer;

wherein a distance between the first portion and the second portion of the wafer is less than a size of a pattern of a structure within the first portion.

3. The method as claimed in claim 2, further comprising sequentially focusing a beam on additional portions of the wafer, and sequentially measuring the step difference between the additional portions of the wafer.

4. The method as claimed in claim 3, wherein the additional portions of the wafer are spaced at a distance equal to the distance between the first portion and the second portion of the wafer.

5. The method as claimed in claim 4, further comprising sequentially recording the step differences of the additional portions of the wafer, and outputting profiles representative of the step differences of the additional portions of the wafer.

6. The method as claimed in claim 1, wherein a first portion height of the pattern within the first portion defines a first horizontal plane, and a second portion height of the pattern within the second portion defines a second horizontal plane that is different from the first horizontal plane.

7. The method as claimed in claim 2, wherein a first portion height of the pattern within the first portion slopes at an angle along the pattern.

8. A method for measuring a step difference in a semiconductor device, the method comprising:

i) vertically moving a focusing lens relative to a horizontal surface of a wafer to focus a first beam onto the wafer such that a first focus point of the first beam is positioned at a first portion of a surface of the wafer;

ii) vertically moving the focusing lens relative to the horizontal surface of the wafer to focus a second beam onto the wafer such that a second focus point of the second beam is positioned at a second portion of the surface of the wafer which is horizontally displaced from the first portion of the surface of the wafer; and iii) measuring the step difference between the first portion and the second portion of the wafer by (a) determining a reference position of the wafer relative to the focusing lens when the first focus point is positioned at the first portion of the surface of the wafer, (b) determining a measured position of the wafer relative to the focusing lens when the second focus point is positioned at the second portion of the surface of the wafer, and (c) determining a vertical displacement distance between the reference position and the measured position, wherein the vertical displacement distance is indicative of the step difference between the first portion and the second portion of the wafer;

wherein the focusing of the first beam comprises:

a) guiding a reflection beam reflected from the first portion toward a detector; and b) adjusting, if the reflection beam is not detected by the detector, a distance between the wafer and the focusing lens; and c) repeating the guiding and adjusting steps until the reflection beam is detected by the detector.

9. A method for measuring a step difference in a semiconductor device, the method comprising:

i) vertically moving a focusing lens relative to a horizontal surface of a wafer to focus a first beam onto the wafer such that a first focus point of the first beam is positioned at a first portion of a surface of the wafer;

ii) vertically moving the focusing lens relative to the horizontal surface of the wafer to focus a second beam onto the wafer such that a second focus point of the second beam is positioned at a second portion of the surface of the wafer which is horizontally displaced from the first portion of the surface of the wafer; and iii) measuring the step difference between the first portion and the second portion of the wafer by (a) determining a reference position of the wafer relative to the focusing lens when the first focus point is positioned at the first portion of the surface of the wafer, (b) determining a measured position of the wafer relative to the focusing lens when the second focus point is positioned at the second portion of the surface of the wafer, and (c) determining a vertical displacement distance between the reference position and the measured position, wherein the vertical displacement distance is indicative of the step difference between the first portion and the second portion of the wafer wherein the focusing of the second beam comprises:

a) guiding a reflection beam reflected from the second portion toward the detector;

b) adjusting, if the reflection beam is not detected by the detector, a distance between the wafer and the focusing lens; and c) repeating the guiding and adjusting steps until the reflection beam is detected by the detector.

10. The method as claimed in claim 8, further comprising moving the wafer vertically for adjusting the distance between the wafer and the focusing lens.

11. The method as claimed in claim 8, further comprising moving the focusing lens vertically for adjusting the distance between the wafer and the focusing lens.

12. The method as claimed in claim 8, further comprising moving the wafer and the focusing lens vertically for adjusting the distance between the wafer and the focusing lens.

* * * * *